(12) United States Patent
Xu

(10) Patent No.: US 11,529,801 B2
(45) Date of Patent: Dec. 20, 2022

(54) METHOD OF FABRICATING STRETCHABLE ELECTRONIC DEVICE, STRETCHABLE ELECTRONIC DEVICE, AND STRETCHABLE DISPLAY APPARATUS

(71) Applicants: Chengdu BOE Optoelectronics Technology Co., Ltd., Sichuan (CN); BOE Technology Group Co., Ltd., Beijing (CN)

(72) Inventor: Yingsong Xu, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 579 days.

(21) Appl. No.: 16/344,326

(22) PCT Filed: Apr. 28, 2018

(86) PCT No.: PCT/CN2018/085066
§ 371 (c)(1),
(2) Date: Apr. 23, 2019

(87) PCT Pub. No.: WO2019/205130
PCT Pub. Date: Oct. 31, 2019

(65) Prior Publication Data
US 2021/0354435 A1     Nov. 18, 2021

(51) Int. Cl.
*B32B 37/14*     (2006.01)
*B32B 27/30*     (2006.01)
(Continued)

(52) U.S. Cl.
CPC ............ *B32B 37/144* (2013.01); *B32B 27/30* (2013.01); *B32B 38/0008* (2013.01);
(Continued)

(58) Field of Classification Search
CPC ... B32B 37/144; B32B 27/30; B32B 38/0008; B32B 38/10; B32B 2038/0028;
(Continued)

(56) References Cited

U.S. PATENT DOCUMENTS 9,723,711 B2 *    8/2017   Elolampi .............. H05K 3/067
10,658,436 B2 *   5/2020   Shin ....................... G09F 9/301
(Continued)

FOREIGN PATENT DOCUMENTS

WO      2011124898 A1     10/2011

OTHER PUBLICATIONS

Ozcam et al, "Effect of ultraviolet/ozone treatment on the surface and bulk properties of poly(dimethyl siloxane) and poly(vinylmethyl siloxane) networks", 2014, Elsevier, Polymer 55, 3107-3119 (Year: 2014).*

(Continued)

*Primary Examiner* — Francisco W Tschen
*Assistant Examiner* — Abhishek A Patwardhan
(74) *Attorney, Agent, or Firm* — Intellectual Valley Law, P.C.

(57) ABSTRACT

The present application provides a method of fabricating a stretchable electronic device. The method includes forming an elastomer polymer layer on a base substrate; selectively stiffening the elastomer polymer layer in a plurality of defined regions of the elastomer polymer layer, thereby forming a modified elastomer polymer layer having a plurality of stiffened portions respectively in a plurality of stiffened regions spaced apart by one or more elastomeric portions in one or more elastomeric regions, the plurality of stiffened portions having a Young's modulus greater than a Young's modulus of the one or more elastomeric portions; and forming a plurality of electronic devices respectively in the plurality of stiffened regions, each of the plurality of (Continued)

electronic devices formed on a side of one of the plurality of stiffened portions distal to the base substrate.

10 Claims, 16 Drawing Sheets

(51) Int. Cl.
  *G09F 9/30* (2006.01)
  *B32B 38/10* (2006.01)
  *B32B 38/00* (2006.01)
(52) U.S. Cl.
  CPC .............. *B32B 38/10* (2013.01); *G09F 9/301* (2013.01); *B32B 2038/0028* (2013.01); *B32B 2305/34* (2013.01); *B32B 2307/51* (2013.01); *B32B 2310/0831* (2013.01); *B32B 2457/20* (2013.01)
(58) Field of Classification Search
  CPC ............ B32B 2305/34; B32B 2307/51; B32B 2310/0831; B32B 2457/20; G09F 9/301; H01L 27/1262; H01L 27/1218
  See application file for complete search history.

(56) References Cited

U.S. PATENT DOCUMENTS

| | | | |
|---|---|---|---|
| 2014/0084286 A1* | 3/2014 | Jeon .................... | H01L 33/0041 438/34 |
| 2015/0048375 A1* | 2/2015 | Oh .................... | H01L 29/78603 264/479 |
| 2017/0352306 A1* | 12/2017 | Hodges ................ | G09G 3/2088 |
| 2017/0374736 A1* | 12/2017 | Reit ..................... | H05K 1/0393 |

OTHER PUBLICATIONS

The Extended European Search Report in the European Patent Application No. 18871828.2, dated Dec. 15, 2021.

* cited by examiner

US 11,529,801 B2

METHOD OF FABRICATING STRETCHABLE ELECTRONIC DEVICE, STRETCHABLE ELECTRONIC DEVICE, AND STRETCHABLE DISPLAY APPARATUS

CROSS-REFERENCE TO RELATED APPLICATION

This application is a national stage application under 35 U.S.C. § 371 of International Application No. PCT/CN2018/085066, filed Apr. 28, 2019, the contents of which are incorporated by reference in the entirety.

TECHNICAL FIELD

The present invention relates to display technology, more particularly, to a method of fabricating a stretchable electronic device, a stretchable electronic device, and a stretchable display apparatus.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allows its length to be increased in one or more dimensions. Stretchable electronic apparatuses may be useful in various applications including in display apparatuses and sensor arrays.

SUMMARY

In one aspect, the present invention provides a method of fabricating a stretchable electronic device, comprising forming an elastomer polymer layer on a base substrate; selectively stiffening the elastomer polymer layer in a plurality of defined regions of the elastomer polymer layer, thereby forming a modified elastomer polymer layer comprising a plurality of stiffened portions respectively in a plurality of stiffened regions spaced apart by one or more elastomeric portions in one or more elastomeric regions, the plurality of stiffened portions having a Young's modulus greater than a Young's modulus of the one or more elastomeric portions; and forming a plurality of electronic devices respectively in the plurality of stiffened regions, each of the plurality of electronic devices formed on a side of one of the plurality of stiffened portions distal to the base substrate.

Optionally, the method further comprises forming a plurality of stretchable signal lines passing through the one or more elastomeric regions thereby connecting adjacent electronic devices of the plurality of electronic devices.

Optionally, each of the plurality of stretchable signal lines has a zig-zag pattern in the one or more elastomeric regions.

Optionally, prior to forming the elastomer polymer layer, the method further comprises forming a sacrificial material layer on the base substrate; and forming a plurality of first recesses in the sacrificial material layer thereby forming a sacrificial layer; wherein the plurality of first recesses respectively correspond to the plurality of defined regions.

Optionally, subsequent to forming the plurality of electronic devices, the method further comprises removing the sacrificial layer thereby separating the modified elastomer polymer layer from the base substrate.

Optionally, prior to forming the plurality of electronic devices, the method further comprises removing the sacrificial layer thereby separating the modified elastomer polymer layer from the base substrate.

Optionally, prior to selectively stiffening the elastomer polymer layer, the method further comprises forming a plurality of second recesses partially extending into the elastomer polymer layer; wherein the plurality of second recesses respectively correspond to the plurality of defined regions; and selectively stiffening the elastomer polymer layer comprises stiffening an elastomer polymer material in regions corresponding to the plurality of second recesses.

Optionally, prior to forming the plurality of electronic devices, the method further comprises separating the modified elastomer polymer layer from the base substrate; and stretching the modified elastomer polymer layer to form a stretched modified elastomer polymer layer.

Optionally, the method further comprises transferring the stretched modified elastomer polymer layer to an intermediate base substrate; wherein the plurality of electronic devices are formed on the stretched modified elastomer polymer layer respectively in the plurality of stiffened regions.

Optionally, subsequent to forming the plurality of electronic devices, the method further comprises forming an encapsulating layer encapsulating the plurality of electronic devices.

Optionally, forming the plurality of electronic devices comprises forming a plurality of thin film transistors respectively in the plurality of stiffened regions.

Optionally, the plurality of thin film transistors are a plurality of top-gate thin film transistors; wherein forming the plurality of thin film transistors comprises forming a buffer layer on a side of the modified elastomer polymer layer distal to the base substrate; forming an active layer on a side of the buffer layer distal to the modified elastomer polymer layer and in the plurality of stiffened regions; forming a gate insulating layer on a side of the active layer distal to the buffer layer; forming a gate electrode on a side of the gate insulating layer distal to the active layer and in the plurality of stiffened regions; forming an inter-layer dielectric layer on a side of the gate electrode distal to the gate insulating layer; patterning the buffer layer, the gate insulating layer, and the inter-layer dielectric layer so that portions of the buffer layer, the gate insulating layer, and the inter-layer dielectric layer in the one or more elastomeric regions are substantially removed; forming a plurality of vias extending through the inter-layer dielectric layer and the gate insulating layer, exposing a source electrode contact region and a drain electrode contact region in the active layer; disposing a conductive material in the plurality of vias thereby forming a source electrode and a drain electrode; forming a passivation layer comprising an elastomer polymer material in the one or more elastomeric regions; and forming a plurality of stretchable signal lines respectively connected to the source electrode and the drain electrode; the plurality of stretchable signal lines formed to pass through the one or more elastomeric regions, thereby forming a thin film transistor array.

Optionally, the plurality of thin film transistors are a plurality of bottom-gate thin film transistors; wherein forming the plurality of thin film transistors comprises forming a buffer layer on a side of the modified elastomer polymer layer distal to the base substrate; forming a gate electrode on a side of the buffer layer distal to the modified elastomer polymer layer and in the plurality of stiffened regions; forming a gate insulating layer on a side of the gate electrode distal to the buffer layer; forming an active layer on a side of the gate insulating layer distal to the gate electrode and in the plurality of stiffened regions; forming an inter-layer dielectric layer on a side of the active layer distal to the gate insulating layer; patterning the buffer layer, the gate insulating layer, and the inter-layer dielectric layer so that portions of the buffer layer, the gate insulating layer, and the inter-layer dielectric layer in the one or more elastomeric regions are substantially removed; forming a plurality of vias extending through the inter-layer dielectric layer, exposing a source electrode contact region and a drain electrode contact region in the active layer; disposing a conductive material in the plurality of vias thereby forming a source electrode and a drain electrode; forming a passivation layer comprising an elastomer polymer material in the one or more elastomeric regions; and forming a plurality of stretchable signal lines respectively connected to the source electrode and the drain electrode, the plurality of stretchable signal lines formed to pass through the one or more elastomeric regions, thereby forming a thin film transistor array.

Optionally, forming the plurality of electronic devices further comprises forming a plurality of organic light emitting diodes in the plurality of stiffened regions.

Optionally, selectively stiffening the elastomer polymer layer comprises exposing the elastomer polymer layer in a plurality of exposure regions with an ultraviolet light in an oxygen-containing atmosphere using a mask plate.

Optionally, the elastomer polymer layer comprises a polydimethylsiloxane-based material; the modified elastomer polymer layer in the one or more elastomeric regions comprises the polydimethylsiloxane-based material; and the modified elastomer polymer layer in the plurality of stiffened regions comprises silicon oxide ($SiO_x$).

In another aspect, the present invention provides a stretchable electronic device fabricated by the method described herein.

In another aspect, the present invention provides a stretchable display apparatus comprising the stretchable electronic device described herein.

In another aspect, the present invention provides a method of fabricating a stretchable substrate for electronic device, comprising forming an elastomer polymer layer on a base substrate; and selectively stiffening the elastomer polymer layer in a plurality of defined regions of the elastomer polymer layer, thereby forming a modified elastomer polymer layer comprising a plurality of stiffened portions respectively in a plurality of stiffened regions spaced apart by one or more elastomeric portions in one or more elastomeric regions, the plurality of stiffened portions having a Young's modulus greater than a Young's modulus of the one or more elastomeric portions.

Optionally, prior to forming the elastomer polymer layer, the method further comprises forming a sacrificial material layer on the base substrate; and forming a plurality of first recesses in the sacrificial material layer thereby forming a sacrificial layer; wherein the plurality of first recesses respectively correspond to the plurality of defined regions.

Optionally, the method further comprises removing the sacrificial layer thereby separating the modified elastomer polymer layer from the base substrate.

Optionally, prior to selectively stiffening the elastomer polymer layer, the method further comprises forming a plurality of second recesses partially extending into the elastomer polymer layer; wherein the plurality of second recesses respectively correspond to the plurality of defined regions; and selectively stiffening the elastomer polymer layer comprises stiffening an elastomer polymer material in regions corresponding to the plurality of second recesses.

Optionally, the method further comprises separating the modified elastomer polymer layer from the base substrate; and stretching the modified elastomer polymer layer to form a stretched modified elastomer polymer layer.

Optionally, the method further comprises transferring the stretched modified elastomer polymer layer to an intermediate base substrate.

Optionally, selectively stiffening the elastomer polymer layer comprises exposing the elastomer polymer layer in a plurality of exposure regions with an ultraviolet light in an oxygen-containing atmosphere using a mask plate.

Optionally, the elastomer polymer layer comprises a polydimethylsiloxane-based material; the modified elastomer polymer layer in the one or more elastomeric regions comprises the polydimethylsiloxane-based material; and the modified elastomer polymer layer in the plurality of stiffened regions comprises silicon oxide ($SiO_x$).

In another aspect, the present invention provides a stretchable substrate for electronic device fabricated by the method described herein.

In another aspect, the present invention provides a stretchable display apparatus comprising the stretchable substrate described herein.

In another aspect, the present invention provides a stretchable electronic device, comprising a stretchable elastomer polymer base substrate having a plurality of stiffened portions respectively in a plurality of stiffened regions spaced apart by one or more elastomeric portions in one or more elastomeric regions; and a plurality of electronic devices respectively on the plurality of stiffened portions, and respectively in the plurality of stiffened regions.

Optionally, the stretchable elastomer polymer base substrate in the one or more elastomeric regions comprises a polydimethylsiloxane-based material; and the stretchable elastomer polymer base substrate in the plurality of stiffened regions comprises silicon oxide ($SiO_x$).

In another aspect, the present invention provides a stretchable substrate for electronic device, comprising a stretchable elastomer polymer base substrate having a plurality of stiffened portions respectively in a plurality of stiffened regions spaced apart by one or more elastomeric portions in one or more elastomeric regions.

Optionally, the stretchable elastomer polymer base substrate in the one or more elastomeric regions comprises a polydimethylsiloxane-based material; and the stretchable elastomer polymer base substrate in the plurality of stiffened regions comprises silicon oxide ($SiO_x$).

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
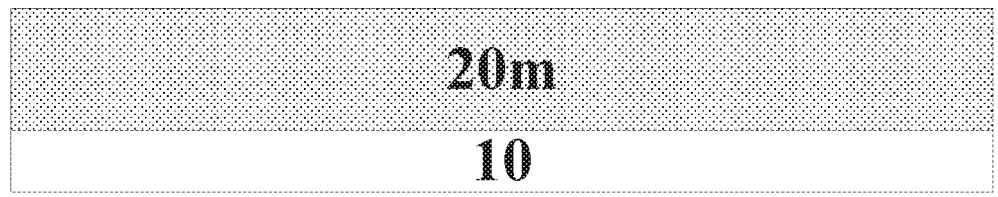
FIGS. 1A to 1I illustrate a process of fabricating a stretchable electronic device in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a method of fabricating a stretchable electronic device, a stretchable electronic device, and a stretchable display apparatus that substantially obviate one or more of the problems due to limitations and disadvantages of the related art. In one aspect, the present disclosure provides a method of fabricating a stretchable electronic device. In some embodiments, the method includes forming an elastomer polymer layer on a base substrate; selectively stiffening the elastomer polymer layer in a plurality of defined regions of the elastomer polymer layer, thereby forming a modified elastomer polymer layer including a plurality of stiffened portions respectively in a plurality of stiffened regions spaced apart by one or more elastomeric portions in one or more elastomeric regions, the plurality of stiffened portions having a Young's modulus greater than a Young's modulus of the one or more elastomeric portions; and forming a plurality of electronic devices respectively in the plurality of stiffened regions, each of the plurality of electronic devices formed on a side of one of the plurality of stiffened portions distal to the base substrate.

As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

FIGS. 1A to 1I illustrate a process of fabricating a stretchable electronic device in some embodiments according to the present disclosure. Referring to FIG. 1A, a sacrificial material layer 20m is formed on a base substrate 10. The sacrificial material layer 20m includes a sacrificial material. Various appropriate sacrificial materials may be used for making the sacrificial material layer 20m. Examples of appropriate sacrificial materials include water-soluble materials. Examples of appropriate sacrificial materials further includes various metal materials that can be etched by an etchant (e.g., a wet etchant). Examples of appropriate sacrificial materials further includes materials suitable for lift-off (e.g., laser lift-off), such as silicon oxide and silicon nitride.

Figure 1B:
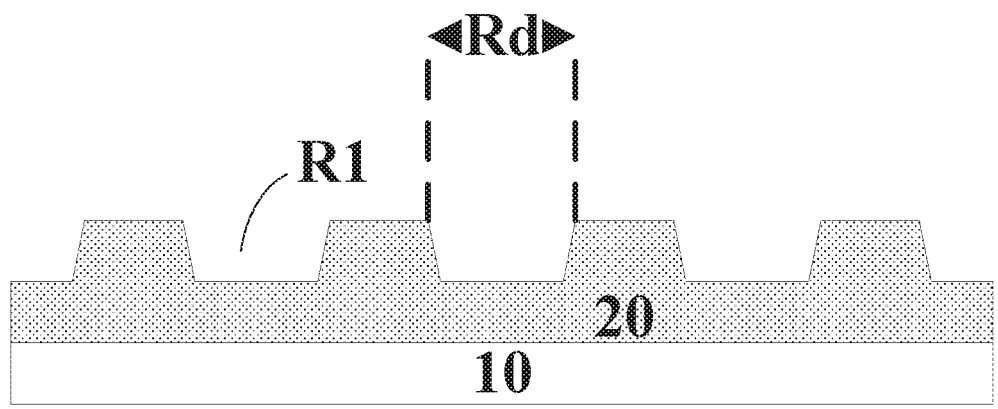

Referring to FIG. 1B, the sacrificial material layer 20m is patterned to form a plurality of first recesses R1 in the sacrificial material layer 20m thereby forming a sacrificial layer 20. The plurality of first recesses R1 respectively correspond to a plurality of defined regions Rd. During the patterning process, the sacrificial material in the plurality of defined regions Rd is partially removed, thereby forming the plurality of first recesses R1 Optionally, outside the plurality of defined regions Rd, the sacrificial material is substantially unremoved by the patterning step.

Figure 1C:
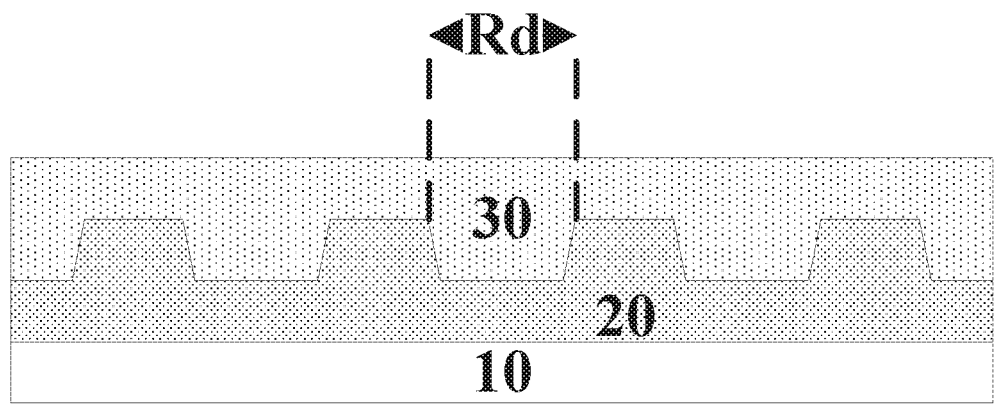
Figure 1D:
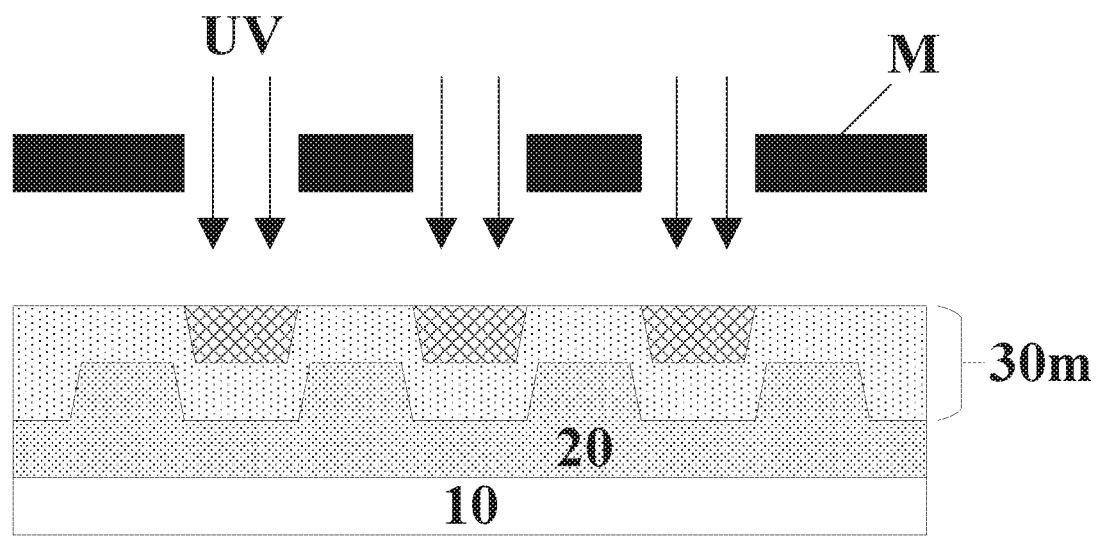

Referring to FIG. 1C, an elastomer polymer layer 30 is formed on a side of the sacrificial layer 20 distal to the base substrate 10. Referring to FIG. 1D, the elastomer polymer layer 30 is selectively stiffened in the plurality of defined regions Rd of the elastomer polymer layer 30. In some embodiments, the stiffening step is performed by exposure to a radiation. In one example as shown in FIG. 1D, the elastomer polymer layer 30 is exposed to an ultraviolet light UV in an oxygen-containing atmosphere in a plurality of exposure regions with using a mask plate M. The mask plate M has a plurality of openings corresponding to the plurality of defined regions Rd. The UV light transmits through the plurality of openings and irradiates on the elastomer polymer layer 30 in the plurality of defined regions Rd, which correspond to a plurality of exposure regions in the elastomer polymer layer 30. Subsequent to the stiffening step, the elastomer polymer layer 30 is converted into a modified elastomer polymer layer 30m.

Various appropriate stiffening methods may be used for selectively stiffening the elastomer polymer layer 30. Examples of appropriate stiffening methods include chemical stiffening, stiffening by irradiation (e.g., stiffening by radiation-induced cross-linking, stiffening by radiation-induced decomposition), mechanical stiffening, physical stiffening (e.g., freeze-drying, heating), and other stiffening methods.

Various appropriate elastomer polymer materials may be used for making the elastomer polymer layer 30. Examples of appropriate elastomer polymers include polyimides, polysilicones, polysiloxanes, polyepoxides, silicone-based polymers (e.g., poly dimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, actyl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

Optionally, the elastomer polymer layer includes a polydimethylsiloxane-based material. The stiffening step is performed by ultraviolet light irradiation in an oxygen-containing atmosphere. The stiffening step partially degrades the polydimethylsiloxane-based material into $SiO_x$.

Figure 1E:
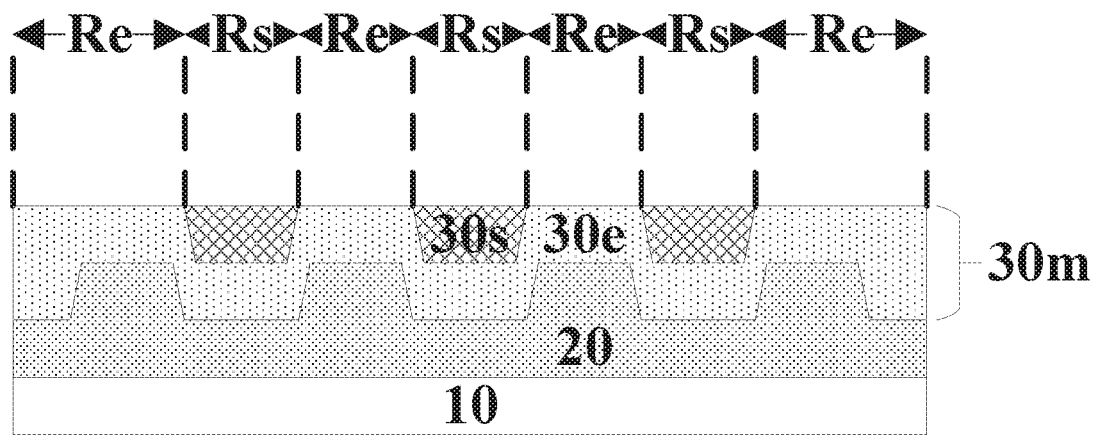

Referring to FIG. 1E, the modified elastomer polymer layer 30m is formed to have a plurality of stiffened portions 30s respectively in a plurality of stiffened regions Rs spaced apart by one or more elastomeric portions 30e in one or more elastomeric regions Re. The plurality of stiffened portions 30s have a Young's modulus greater than a Young's modulus of the one or more elastomeric portions 30e. Optionally, a ratio of the Young's modulus of the plurality of stiffened portions 30s to the Young's modulus of the one or more elastomeric portions 30e is greater than 2, e.g., greater than 3, greater than 4, greater than 5, greater than 7.5, greater than 10, greater than 20, greater than 30, greater than 40, greater than 50, greater than 60, greater than 70, greater than 80, greater than 90, and greater than 100. The plurality of stiffened regions Rs correspond to the plurality of defined regions Rd in FIG. 1B and FIG. 1C.

Optionally, the one or more elastomeric portions 30e have a Young's modulus in a range of approximately 0.001 GPa to approximately 0.5 GPa, e.g., approximately 0.001 GPa to approximately 0.05 GPa, approximately 0.05 GPa to approximately 0.1 GPa, approximately 0.1 GPa to approximately 0.2 GPa, approximately 0.2 GPa to approximately 0.3 GPa, approximately 0.3 GPa to approximately 0.4 GPa, and approximately 0.4 GPa to approximately 0.5 GPa, Optionally, the one or more elastomeric portions 30e have a Young's modulus in a range of approximately 0.5 GPa to approximately 1.5 GPa, e.g., approximately 0.5 GPa to approximately 1.0 GPa and approximately 1.0 GPa to approximately 1.5 GPa.

Optionally, the plurality of stiffened portions 30s have a Young's modulus greater than 2.0 GPa, e.g., in a range of approximately 2.0 GPa to approximately 20 GPa, e.g., approximately 2.0 GPa to approximately 4.0 GPa, approximately 4.0 GPa to approximately 6.0 GPa, approximately 6.0 GPa to approximately 8.0 GPa, approximately 8.0 GPa to approximately 10 GPa, approximately 10 GPa to approximately 12.5 GPa, approximately 12.5 GPa to approximately 15 GPa, approximately 15 GPa to approximately 17.5 GPa, and approximately 17.5 GPa to approximately 20 GPa. Optionally, the plurality of stiffened portions 30s have a Young's modulus greater than 20 GPa, e.g., greater than 40 GPa, greater than 60 GPa, greater than 80 GPa, greater than 100 GPa, greater than 150 GPa, greater than 200 GPa, greater than 300 GPa, greater than 400 GPa, greater than 500 GPa, greater than 600 GPa, greater than 700 GPa, greater than 800 GPa, greater than 900 GPa, and greater than 1000 GPa.

Figure 1F:
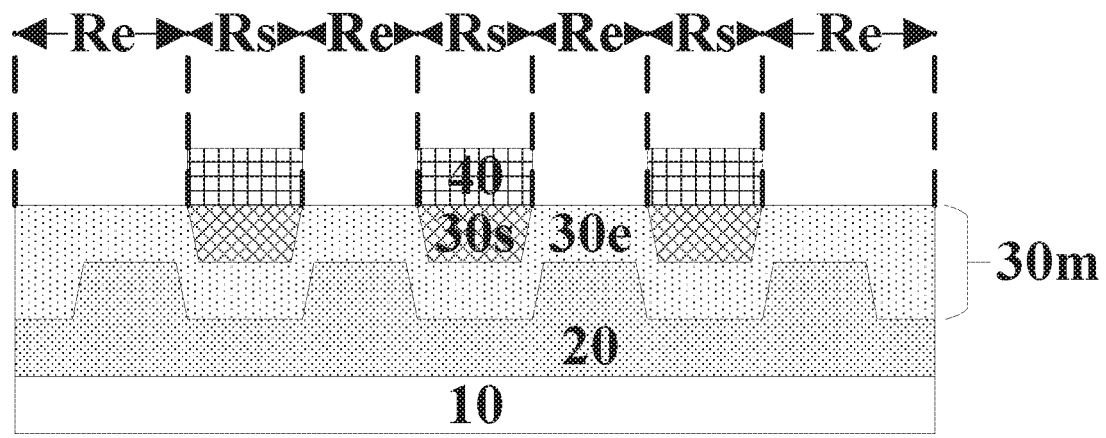

Referring to FIG. 1F, a plurality of electronic devices 40 are formed respectively in the plurality of stiffened regions Rs. Each of the plurality of electronic devices 40 is formed on a side of one of the plurality of stiffened portions 30s distal to the base substrate 10. The plurality of electronic devices 40 may be any appropriate electronic devices including thin film transistors, organic light emitting diodes, photosensors, and the like. By forming the plurality of electronic devices 40 in the plurality of stiffened regions Rs, any potential damages to the plurality of electronic devices 40 during stretching of the substrate can be avoided. Optionally, the substrate is a thin film transistor array substrate, and the plurality of electronic devices 40 are a plurality of thin film transistors.

Figure 1G:
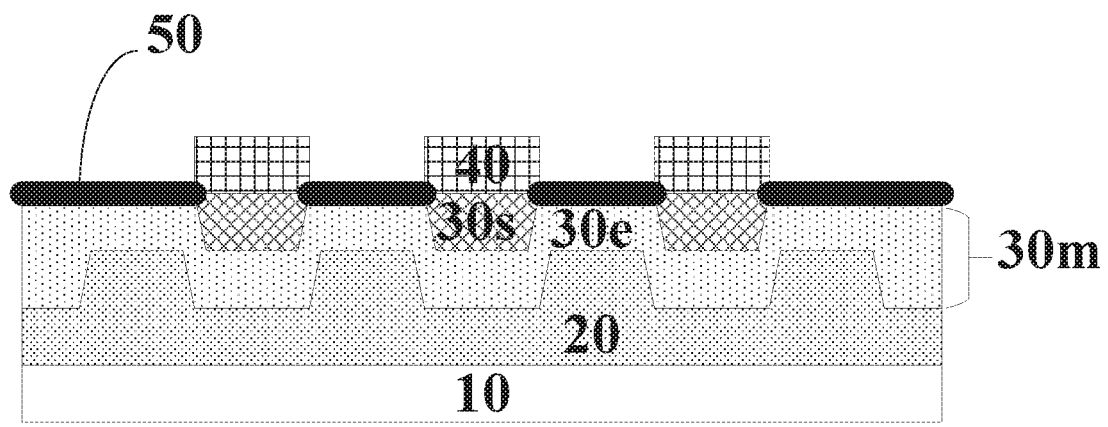
Figure 3:
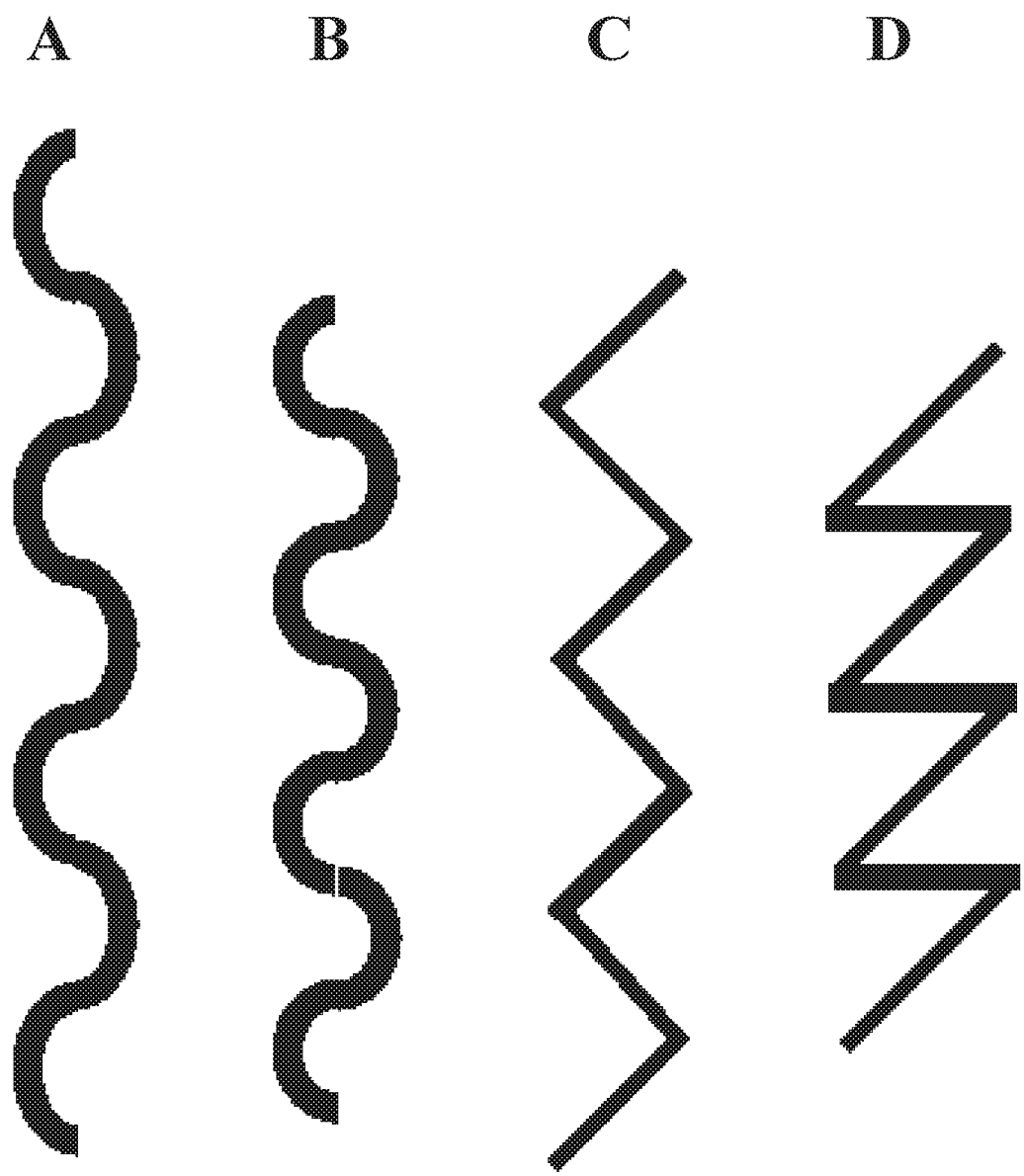
FIG. 3 illustrates patterns of several signal lines in some embodiments according to the present disclosure.

Referring to FIG. 1G, a plurality of stretchable signal lines 50 are formed on a side of the modified elastomer polymer layer 30m distal to the base substrate 10. The plurality of stretchable signal lines 50 are formed to connect adjacent electronic devices of the plurality of electronic devices 40. The plurality of stretchable signal lines 50 pass through the one or more elastomeric regions Re. Various appropriate materials may be used for making the plurality of stretchable signal lines 50. Examples of appropriate conductive materials for making the plurality of stretchable signal lines 50 include metals, alloys, graphene, carbon nanotubes, flexible conductive polymers, and other flexible conductive materials. The plurality of stretchable signal lines 50 may be made to have various appropriate patterns. Examples of appropriate patterns of the plurality of stretchable signal lines 50 include straight lines, curve lines, and any combination thereof. FIG. 3 illustrates patterns of several signal lines in some embodiments according to the present disclosure. Referring to FIG. 3, in some embodiments, each of the plurality of stretchable signal lines 50 may have a zig-zag pattern in the one or more elastomeric regions Re. As shown in FIG. 3, the zig-zag pattern may be one with round corners (A and B), or one with sharp corners (C and D). In FIG. 3, signal line A illustrates a stretched state of signal line B, and signal line C illustrates a stretched state of signal line D.

Figure 1H:
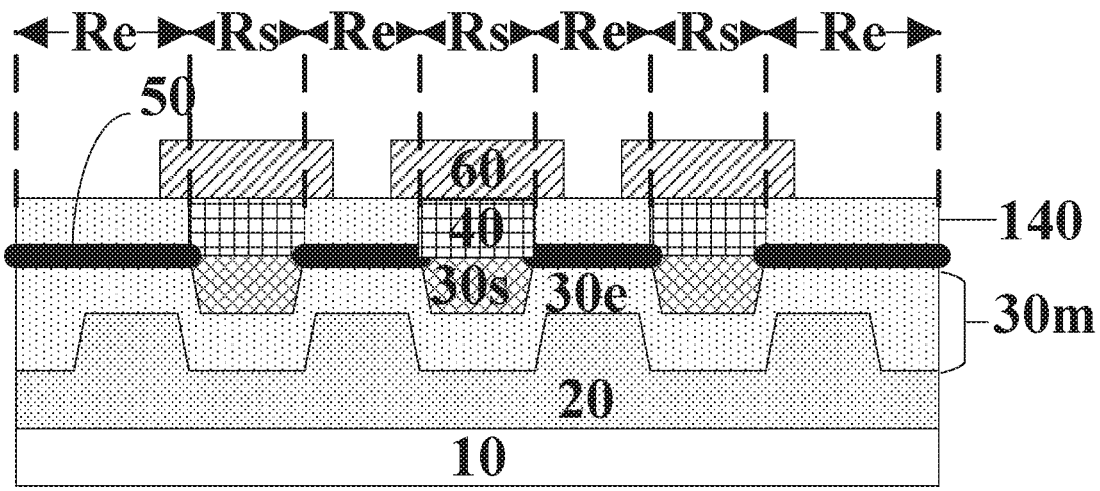

Referring to FIG. 1H, a passivation layer 140 is formed on a side of the plurality of stretchable signal lines 50 distal to the modified elastomer polymer layer 30m. The passivation layer 140 includes an elastomer polymer material, and is formed in the one or more elastomeric regions Re. Moreover, an encapsulating layer 60 is formed on a side of the plurality of electronic devices 40 distal to the base substrate 10, thereby encapsulating the plurality of electronic devices 40.

Figure 1I:
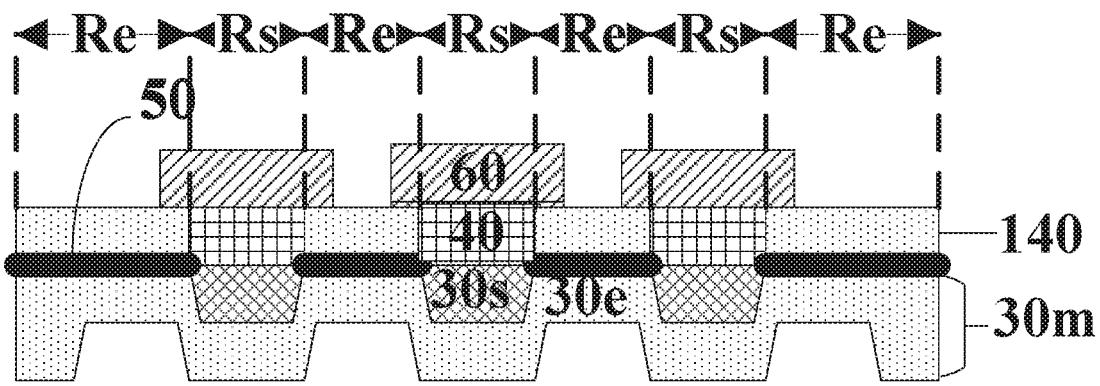

Referring to FIG. 1I, the sacrificial layer 20 is removed, thereby separating the modified elastomer polymer layer 30m (along with the plurality of electronic devices 40 thereon) from the base substrate 10. Various appropriate methods may be used for removing the sacrificial layer 20. In one example, the sacrificial layer 20 is removed by dissolving the sacrificial material by a solvent, e.g., water. In another example, the sacrificial layer 20 is removed by etching the sacrificial material by an etchant, e.g., a wet etchant. In another example, the sacrificial layer 20 is removed by lift-off, e.g., laser lift-off. The stretchable electronic device as shown in FIG. 1I is stretchable, e.g., in the one or more elastomeric portions 30e.

Figure 2A:
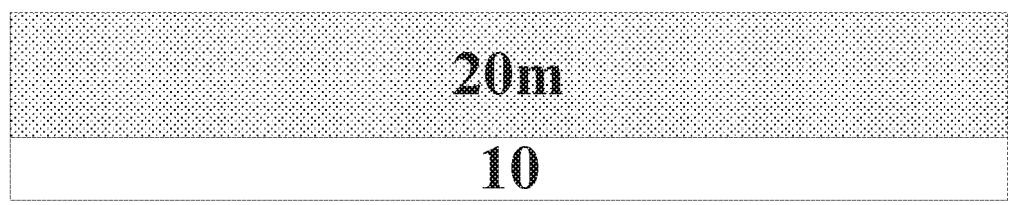
FIGS. 2A to 2M illustrate a process of fabricating a stretchable electronic device in some embodiments according to the present disclosure.
Figure 2B:
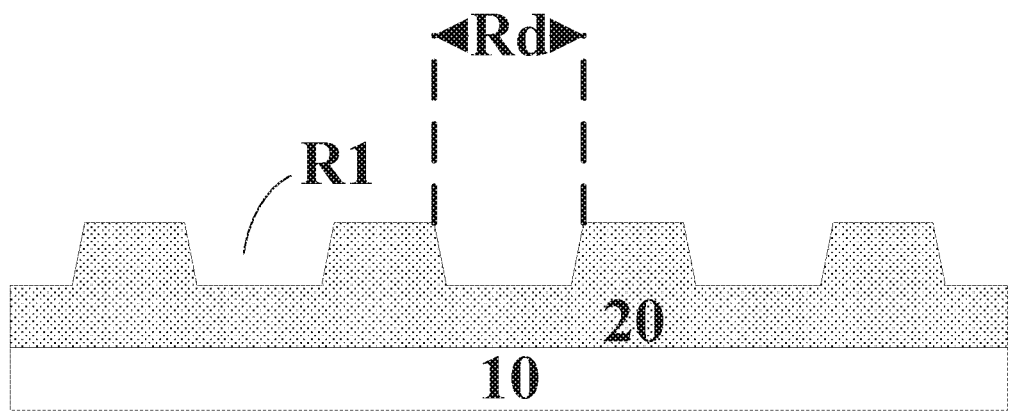
Figure 2C:
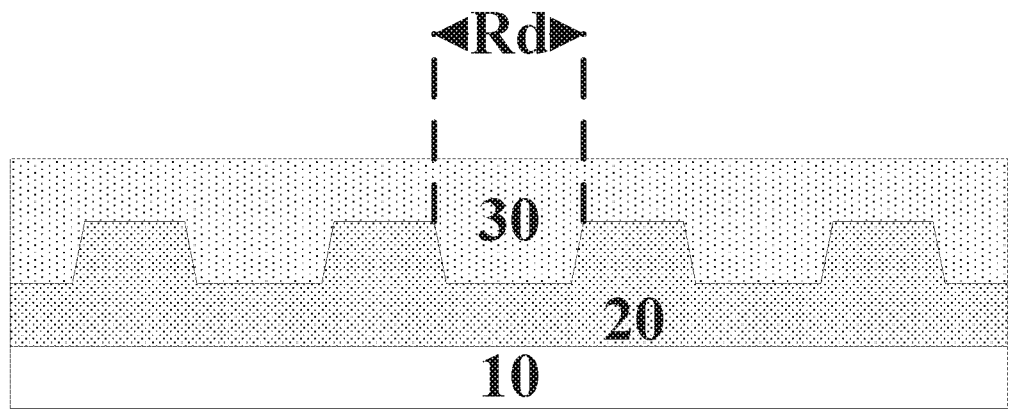

FIGS. 2A to 2M illustrate a process of fabricating a stretchable electronic device in some embodiments according to the present disclosure. FIGS. 2A to 2C illustrate processes similar to those illustrated in FIGS. 1A to 1C. For example, as shown in FIG. 2A, a sacrificial material layer 20m is formed on a base substrate 10. As shown in FIG. 2B, the sacrificial material layer 20m is patterned to form a plurality of first recesses R1 in the sacrificial material layer 20m thereby forming a sacrificial layer 20. As shown in FIG. 2C, an elastomer polymer layer 30 is formed on a side of the sacrificial layer 20 distal to the base substrate 10.

Figure 2D:
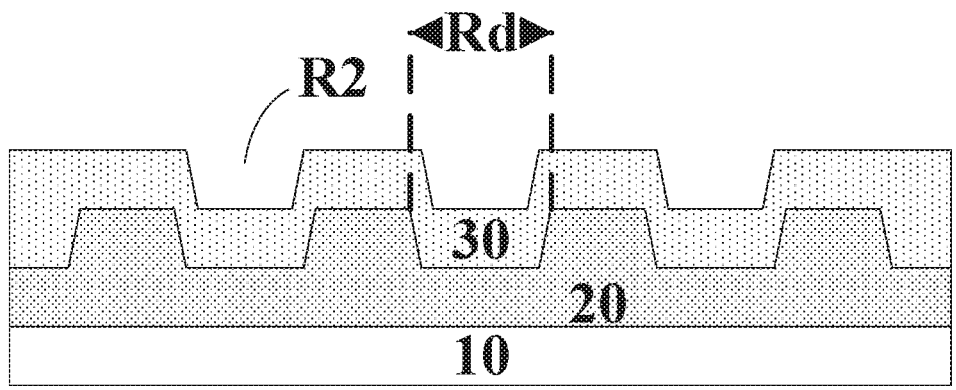

Referring to FIG. 2D, in some embodiments, prior to selectively stiffening the elastomer polymer layer 30, a plurality of second recesses R2 are first formed partially extending into the elastomer polymer layer 30. The plurality of second recesses R2 may be formed by any appropriate methods. In one example, the elastomer polymer layer 30 may be patterned to remove a portion of the elastomer polymer layer, thereby forming the plurality of second recesses R2. In another example, the sacrificial layer 20 may be used as mold, and the plurality of second recesses R2 may be formed by pressing a portion of the elastomer polymer layer 30 in the plurality of defined regions Rd. The plurality of second recesses R2 respectively correspond to the plurality of defined regions Rd.

Figure 2E:
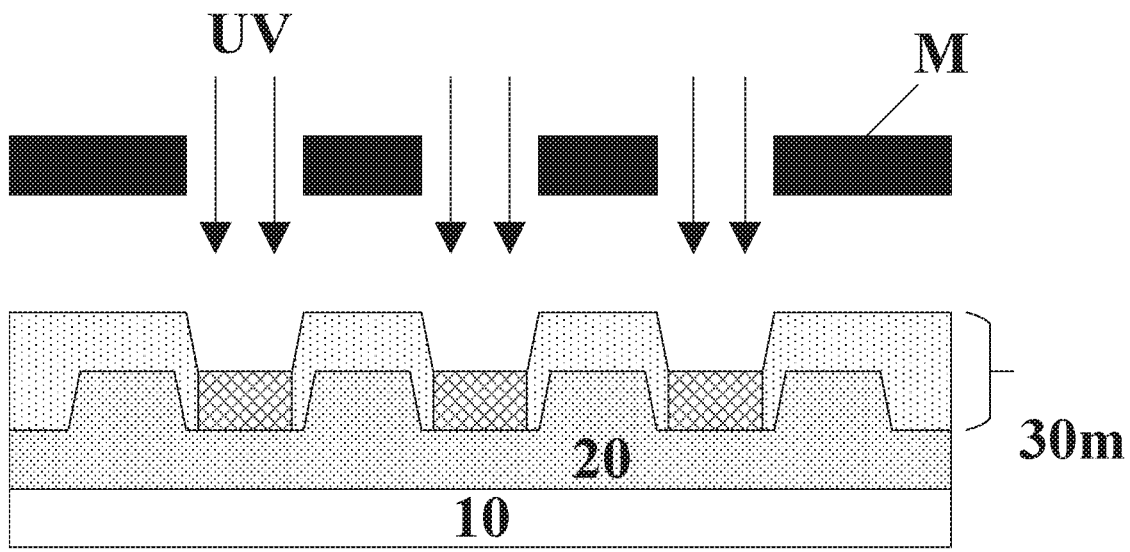

Referring to FIG. 2E, the elastomer polymer layer 30 is selectively stiffened in the plurality of defined regions Rd of the elastomer polymer layer 30, e.g., selectively stiffening an elastomer polymer material in regions corresponding to the plurality of second recesses R2 while the elastomer polymer material in other regions are not stiffened. In some embodiments, the stiffening step is performed by exposure to a radiation. In one example as shown in FIG. 2E, the elastomer polymer layer 30 is exposed to an ultraviolet light UV in an oxygen-containing atmosphere in a plurality of exposure regions with using a mask plate M. The mask plate M has a plurality of openings corresponding to the plurality of defined regions Rd. The LV light transmits through the plurality of openings and irradiates on the elastomer polymer layer 30 in regions corresponding to the plurality of second recesses, which correspond to a plurality of exposure regions in the elastomer polymer layer 30. Subsequent to the stiffening step, the elastomer polymer layer 30 is converted into a modified elastomer polymer layer 30m.

Figure 2F:
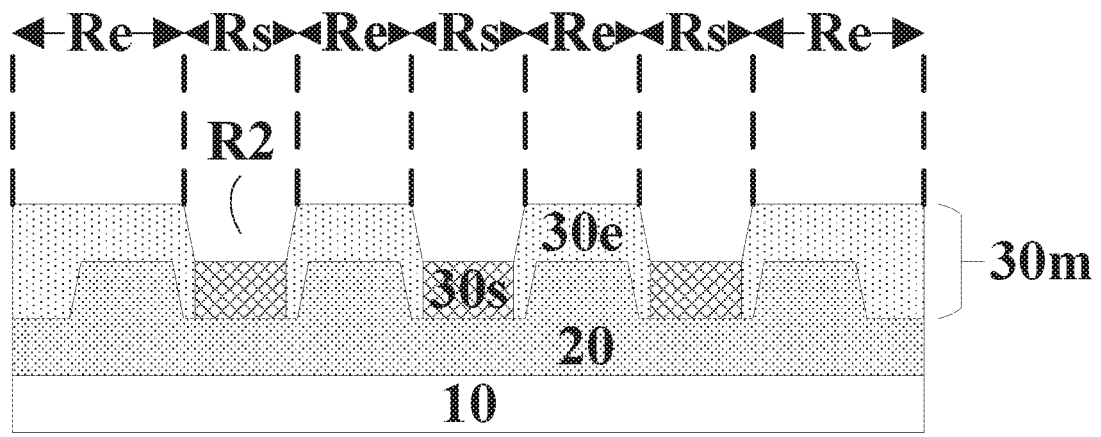

Referring to FIG. 2F, the modified elastomer polymer layer 30m is formed to have a plurality of stiffened portions 30s respectively in a plurality of stiffened regions Rs spaced apart by one or more elastomeric portions 30e in one or more elastomeric regions Re. The plurality of stiffened portions 30s are respectively underneath the plurality of second recesses R2. The plurality of stiffened portions 30s have a Young's modulus greater than a Young's modulus of the one or more elastomeric portions 30e. Optionally, a ratio of the Young's modulus of the plurality of stiffened portions 30s to the Young's modulus of the one or more elastomeric portions 30e is greater than 2, e.g., greater than 3, greater than 4, greater than 5, greater than 7.5, greater than 10, greater than 20, greater than 30, greater than 40, greater than 50, greater than 60, greater than 70, greater than 80, greater than 90, and greater than 100. The plurality of stiffened regions Rs correspond to the plurality of defined regions Rd in FIG. 1B and FIG. 1C. Optionally, an entire thickness of the plurality of stiffened portions 30s is stiffened.

Figure 2G:
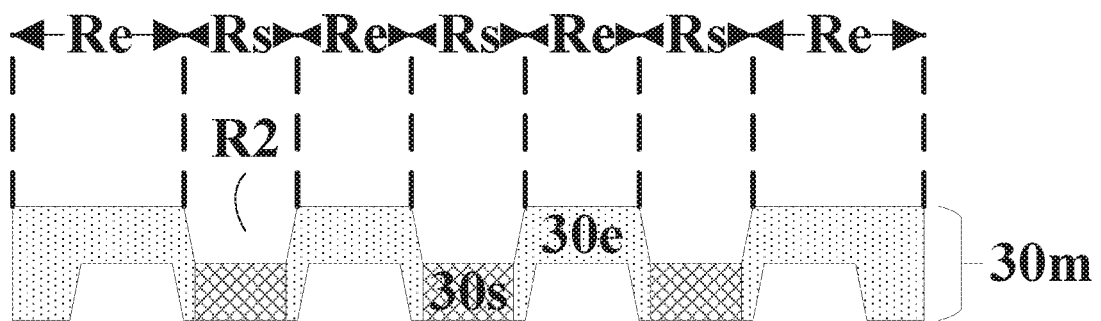

Referring to FIG. 2G, the sacrificial layer 20 is removed, thereby separating the modified elastomer polymer layer 30m from the base substrate 10. The stretchable electronic device as shown in FIG. 2G is stretchable, e.g., in the one or more elastomeric portions 30e.

Figure 2H:
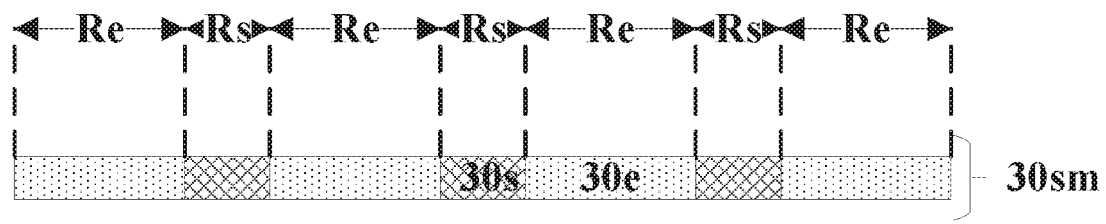

Referring to FIG. 2H, the modified elastomer polymer layer 30m is stretched to form a stretched modified elastomer polymer layer 30sm. Specifically, the one or more elastomeric portions. 30e of the modified elastomer polymer layer 30m are stretched while the plurality of stiffened portions 30s are substantially unstretched or stretched to a smaller degree. As shown in FIG. 2H, the stretched modified elastomer polymer layer 30sm has a plurality of stiffened portions 30s respectively in a plurality of stiffened regions Rs spaced apart by one or more elastomeric portions 30e in one or more elastomeric regions Re.

Figure 2I:
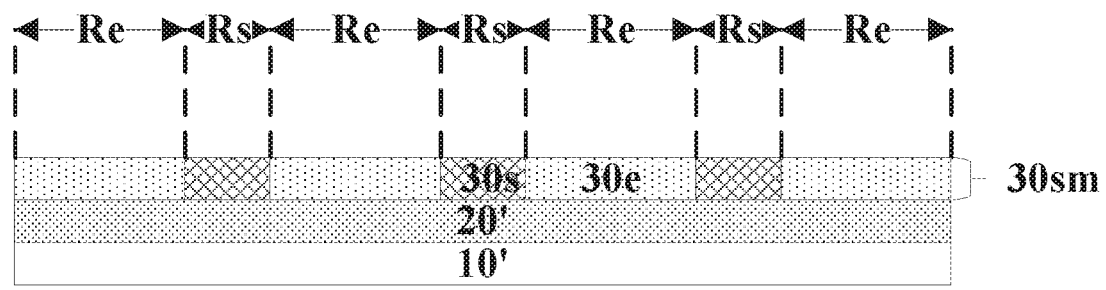

Referring to FIG. 2I, the stretched modified elastomer polymer layer 30sm is transferred to an intermediate base substrate 10' having an intermediate sacrificial layer 20' formed on the intermediate base substrate 10'.

Figure 2J:
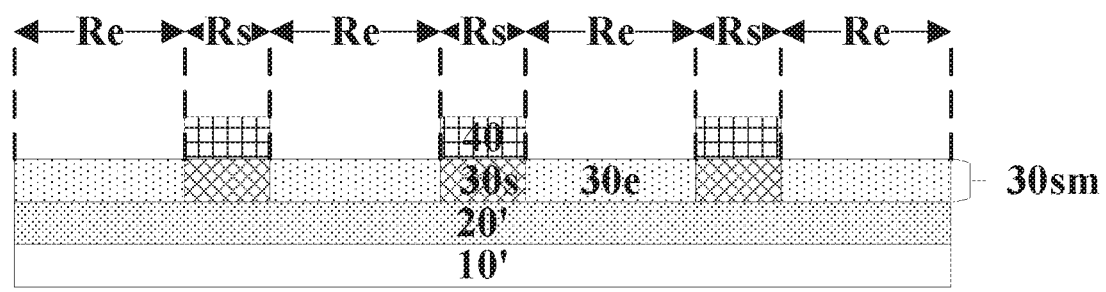

Referring to FIG. 2J, a plurality of electronic devices 40 are formed on the stretched modified elastomer polymer layer 30sm respectively in the plurality of stiffened regions Rs. Each of the plurality of electronic devices 40 is formed on a side of one of the plurality of stiffened portions 30s distal to the intermediate base substrate 10'. The plurality of electronic devices 40 may be any appropriate electronic devices including thin film transistors, organic light emitting diodes, photosensors, and the like.

Figure 2K:
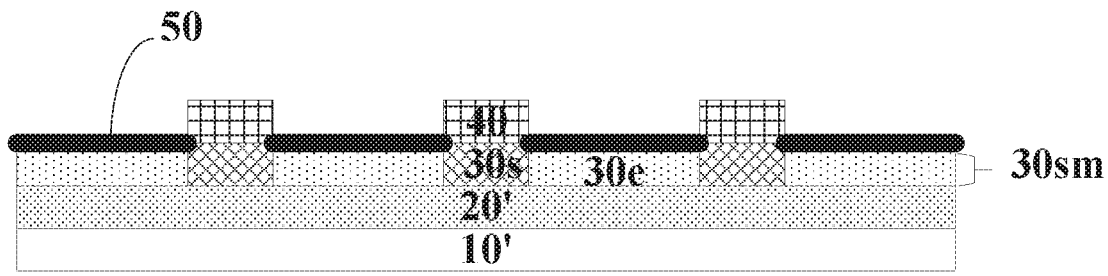

Referring to FIG. 2K, a plurality of stretchable signal lines 50 are formed on a side of the stretched modified elastomer polymer layer 30sm distal to the intermediate base substrate 10'. The plurality of stretchable signal lines 50 are formed to connect adjacent electronic devices of the plurality of electronic devices 40. The plurality of stretchable signal lines 50 pass through the one or more elastomeric regions Re.

Figure 2L:
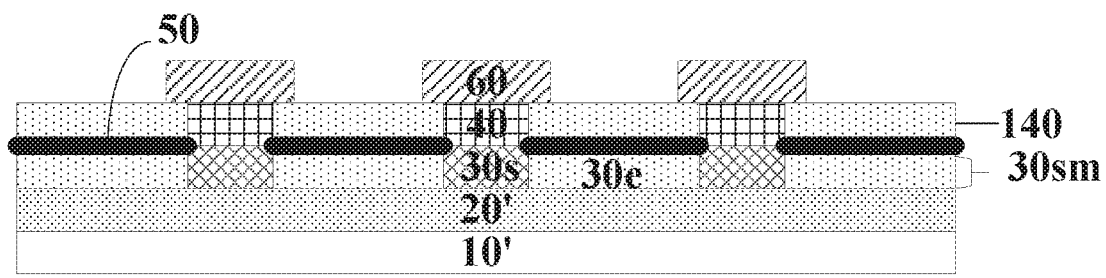

Referring to FIG. 2L, a passivation layer 140 is formed on a side of the plurality of stretchable signal lines 50 distal to the stretched modified elastomer polymer layer 30sm. The passivation layer 140 includes an elastomer polymer material, and is formed in the one or more elastomeric regions Re. Subsequently, an encapsulating layer 60 is formed on a side of the plurality of electronic devices 40 distal to the base substrate 10, thereby encapsulating the plurality of electronic devices 40.

Figure 2M:
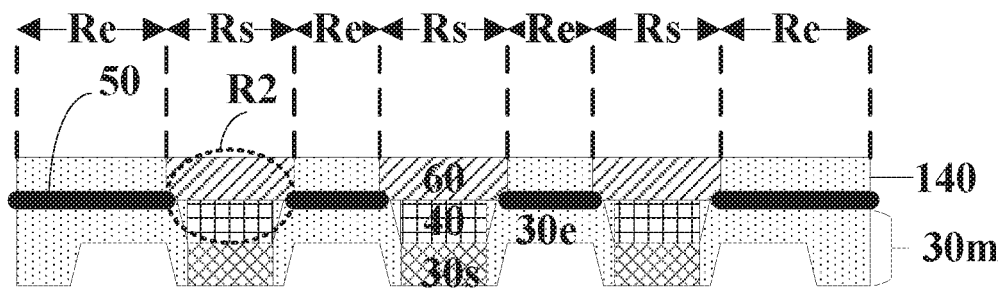

Referring to FIG. 2M, the intermediate sacrificial layer 20' is removed, thereby separating the stretched modified elastomer polymer layer 30sm (along with the plurality of electronic devices 40 thereon) from the intermediate base substrate 10'. Without the constraints of the intermediate base substrate 10', the stretched modified elastomer polymer layer 30sm (along with the plurality of electronic devices 40 thereon) returns into a substantially unstretched state, e.g., becoming a modified elastomer polymer layer 30m. The stretchable electronic device as shown in FIG. 2M is stretchable, e.g., in the one or more elastomeric portions 30e.

Figure 4A:
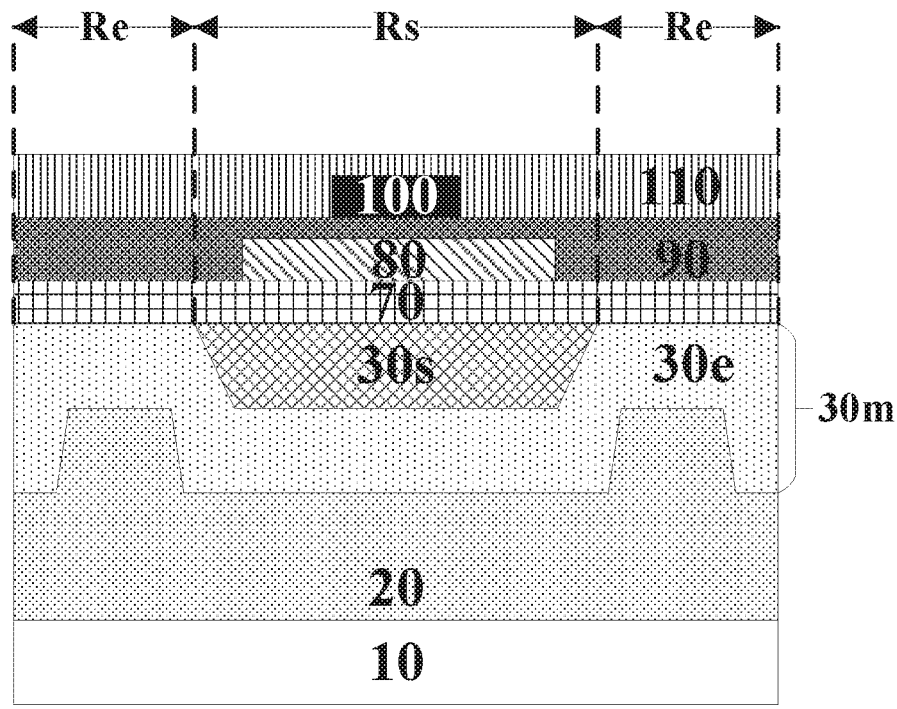
FIGS. 4A to 4F illustrate a process of fabricating a top-gate transistor in some embodiments according to the present disclosure.

FIGS. 4A to 4F illustrate a process of fabricating a top-gate thin film transistor in some embodiments according to the present disclosure. Referring to FIG. 4A, a buffer layer 70 is formed on a side of the modified elastomer polymer layer 30m distal to the base substrate 10, an active layer 80 is formed on a side of the buffer layer 70 distal to the modified elastomer polymer layer 30m and in the plurality of stiffened regions Rs, a gate insulating layer 90 is formed on a side of the active layer 80 distal to the buffer layer 70, a gate electrode 100 is formed on a side of the gate insulating layer 90 distal to the active layer 80 and in the plurality of stiffened regions Rs, and an inter-layer dielectric layer 110 is formed on a side of the gate electrode 100 distal to the gate insulating layer 90.

Figure 4B:
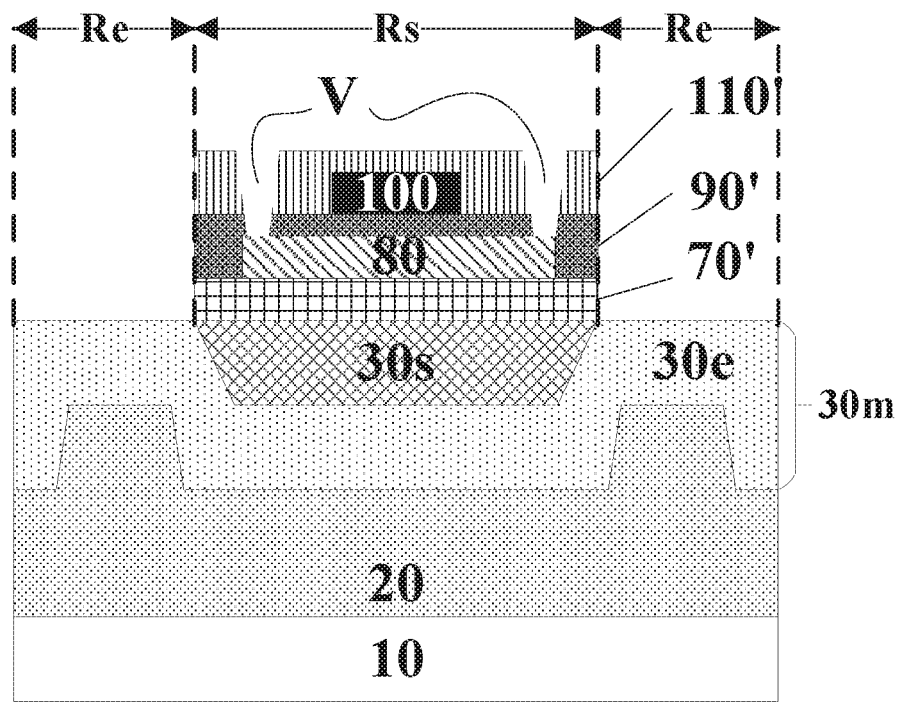

Referring to FIG. 4B, a plurality of vias V are formed extending through the inter-layer dielectric layer 110 and the gate insulating layer 90, exposing a source electrode contact region and a drain electrode contact region in the active layer 80. Moreover, the buffer layer 70, the gate insulating layer 90, and the inter-layer dielectric layer 110 are patterned to remove portions of the buffer layer 70, the gate insulating layer 90, and the inter-layer dielectric layer 110 in the one or more elastomeric regions Re. As shown in FIG. 4B, the patterning step results in a patterned buffer layer 70', a patterned gate insulating layer 90', and a patterned inter-layer dielectric layer 110' substantially in the plurality of stiffened regions Rs.

Figure 4C:
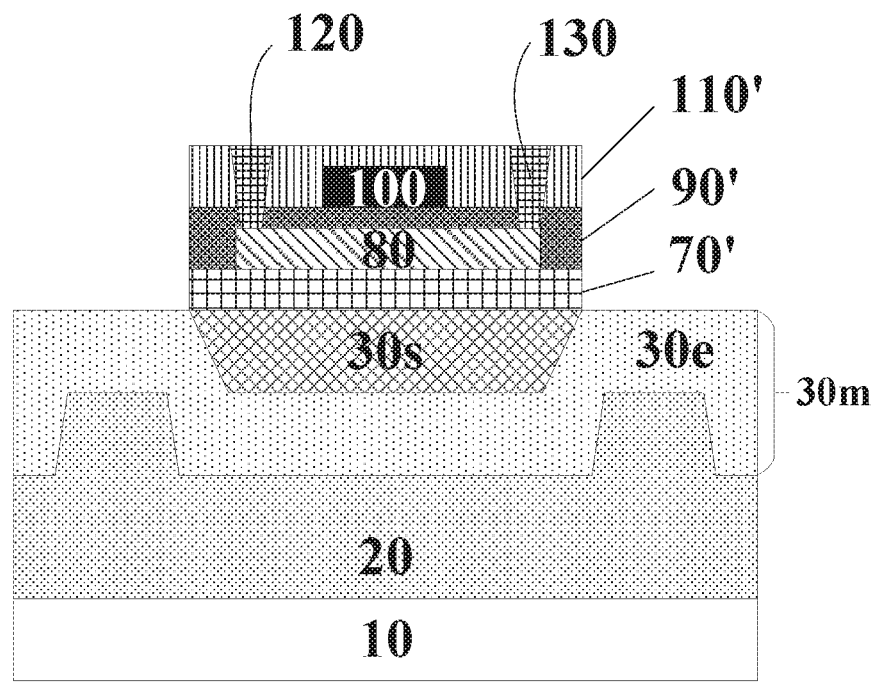

Referring to FIG. 4C, a conductive material is disposed in the plurality of vias, thereby forming a source electrode 120 and a drain electrode 130. The source electrode 120 is electrically connected to a source electrode contact part of the active layer 80, and the drain electrode 130 is electrically connected to a drain electrode contact part of the active layer 80.

Figure 4D:
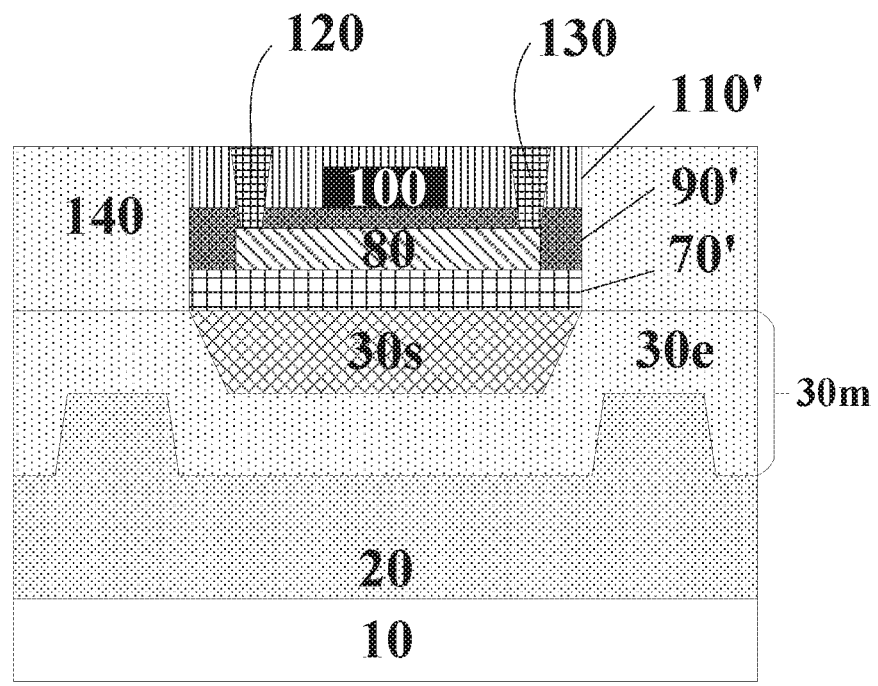

Referring to FIG. 4D, a passivation layer 140 is formed in the one or more elastomeric regions Re, and on a side of the modified elastomer polymer layer 30m distal to the base substrate 10. The passivation layer 140 is made of an elastomer material.

Figure 4E:
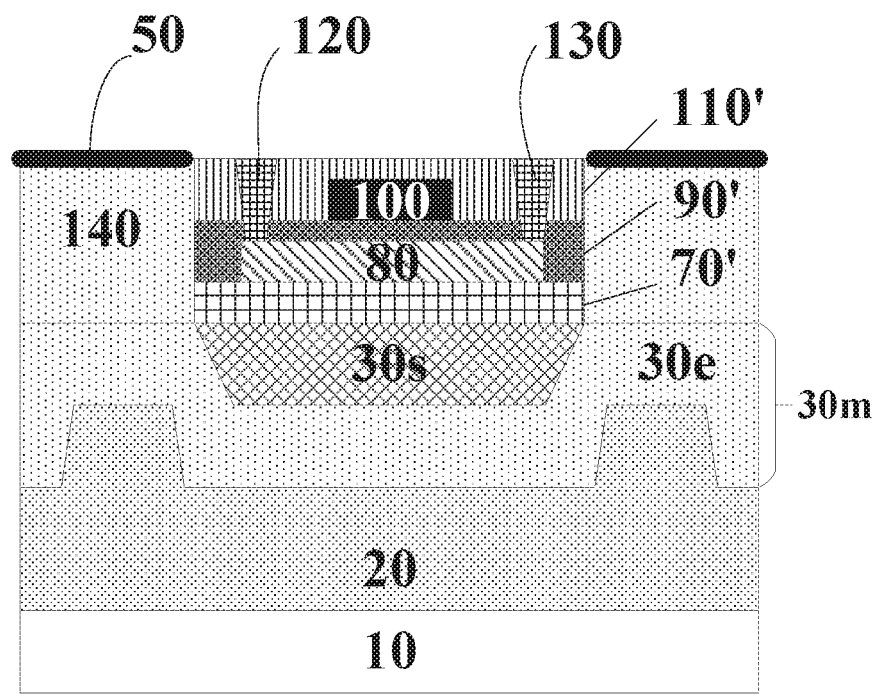

Referring to FIG. 4E, a plurality of stretchable signal lines 50 are formed on a side of the passivation layer 140 distal to the base substrate 10. The plurality of stretchable signal lines 50 are formed to connect the plurality of thin film transistors into a thin film transistors array. The plurality of stretchable signal lines 50 pass through the one or more elastomeric regions Re. Examples of the plurality of stretchable signal lines 50 include gate lines, data lines, power lines, and various other signal lines. Optionally, the plurality of stretchable signal lines 50 are respectively connected to the source electrode 120 and the drain electrode 130.

Figure 4F:
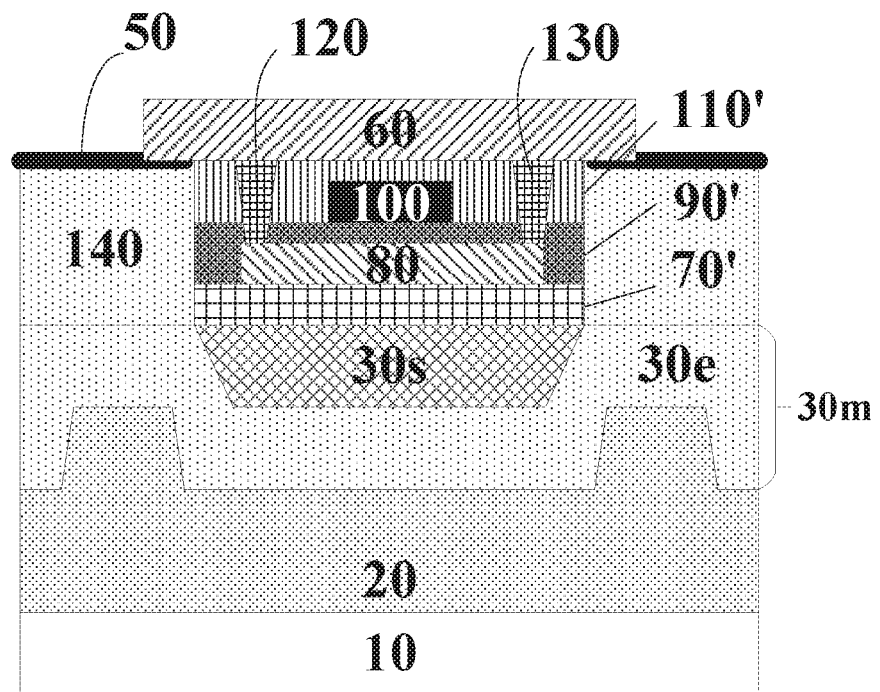

Referring to FIG. 4F, an encapsulating layer 60 is formed on a side of the patterned inter-layer dielectric layer 110' distal to the base substrate 10, thereby encapsulating the plurality of thin film transistors.

Figure 5A:
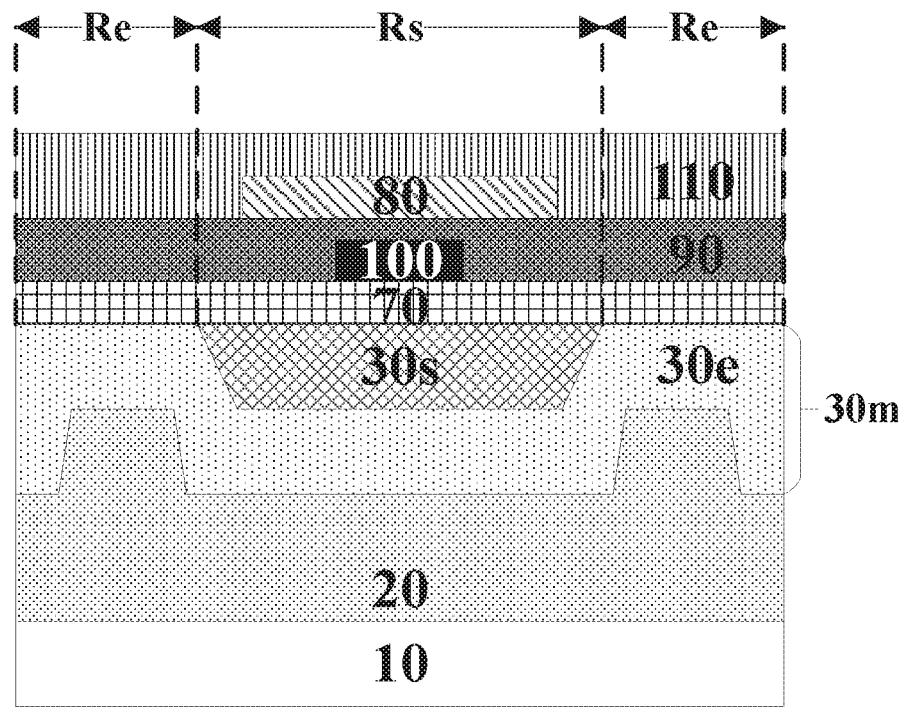
FIGS. 5A to 5F illustrate a process of fabricating a bottom-gate thin film transistor in some embodiments according to the present disclosure.

FIGS. 5A to 5F illustrate a process of fabricating a bottom-gate thin film transistor in some embodiments according to the present disclosure. Referring to FIG. 5A, a buffer layer 70 is formed on a side of the modified elastomer polymer layer 30m distal to the base substrate 10, a gate electrode 100 is formed on a side of the buffer layer 70 distal to the modified elastomer polymer layer 30m and in the plurality of stiffened regions Rs, a gate insulating layer 90 is formed on a side of the gate electrode 100 distal to the buffer layer 70, an active layer 80 is formed on a side of the gate insulating layer 90 distal to the gate electrode 100 and in the plurality of stiffened regions Rs, an inter-layer dielectric layer 110 is formed on a side of the active layer 80 distal to the gate insulating layer 90.

Figure 5B:
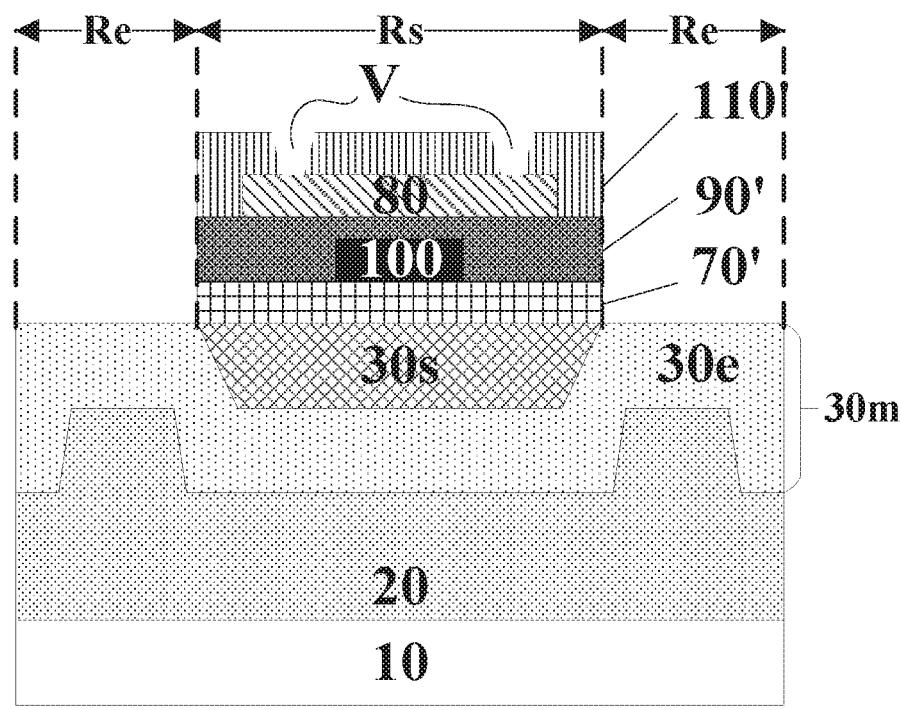

Referring to FIG. 5B, a plurality of vias V are formed extending through the inter-layer dielectric layer 110, exposing a source electrode contact region and a drain electrode contact region in the active layer 80. Moreover, the buffer layer 70, the gate insulating layer 90, and the inter-layer dielectric layer 110 are patterned to remove portions of the buffer layer 70, the gate insulating layer 90, and the inter-layer dielectric layer 110 in the one or more elastomeric regions Re. As shown in FIG. 5B, the patterning step results in a patterned buffer layer 70', a patterned gate insulating layer 90', and a patterned inter-layer dielectric layer 110' substantially in the plurality of stiffened regions Rs.

Figure 5C:
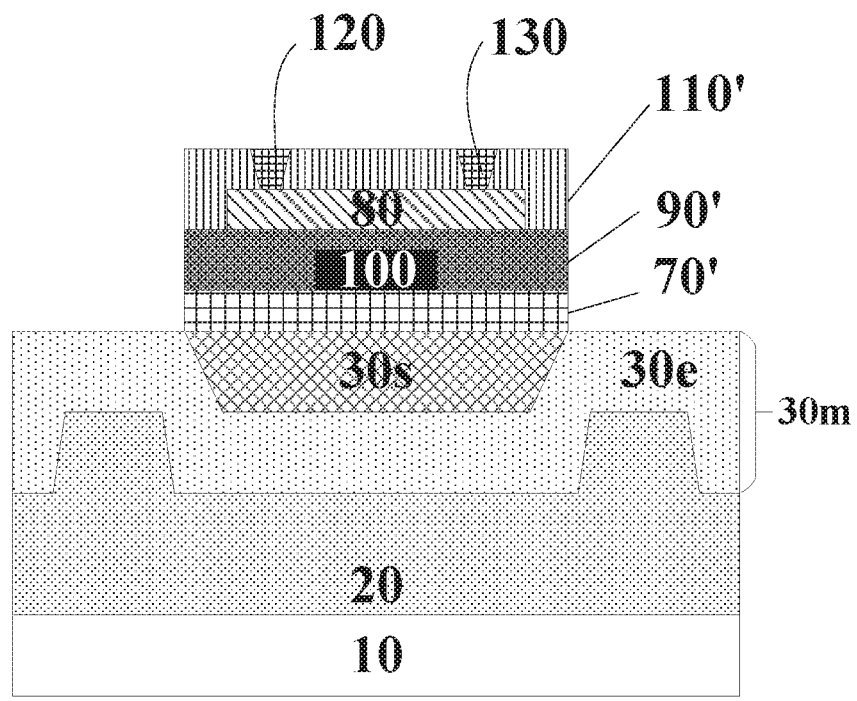
Figure 5D:
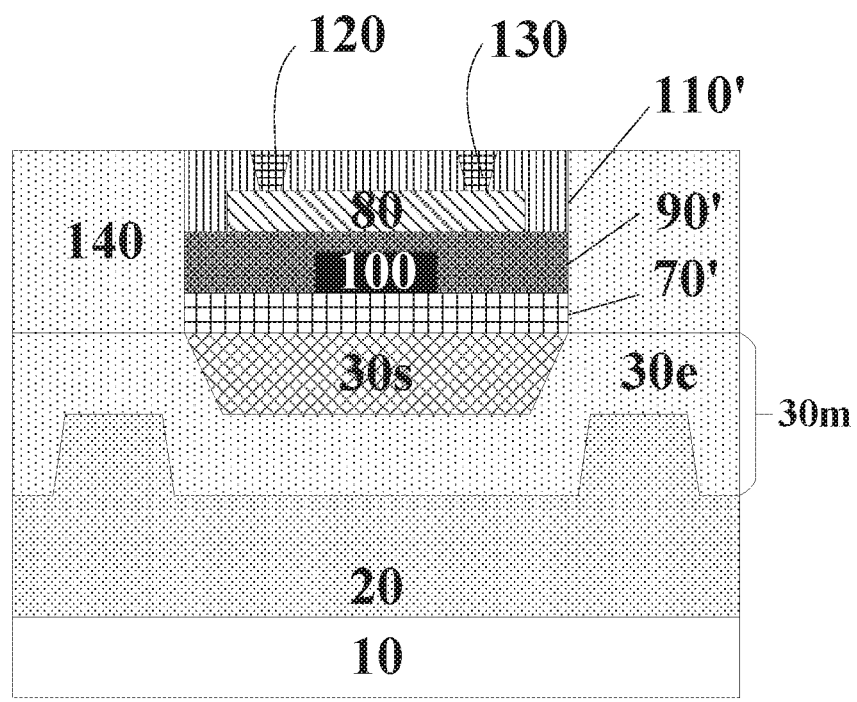
Figure 5E:
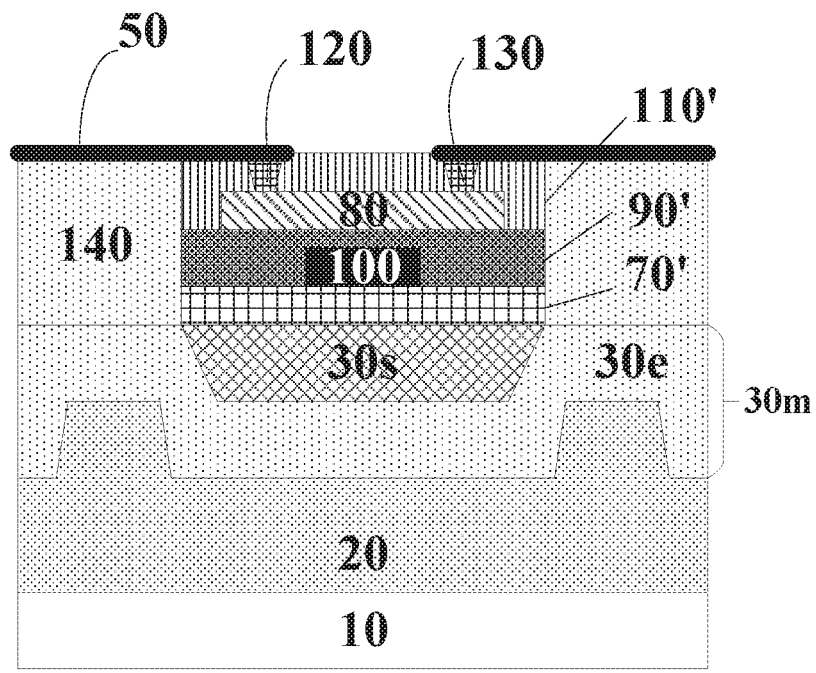
Figure 5F:
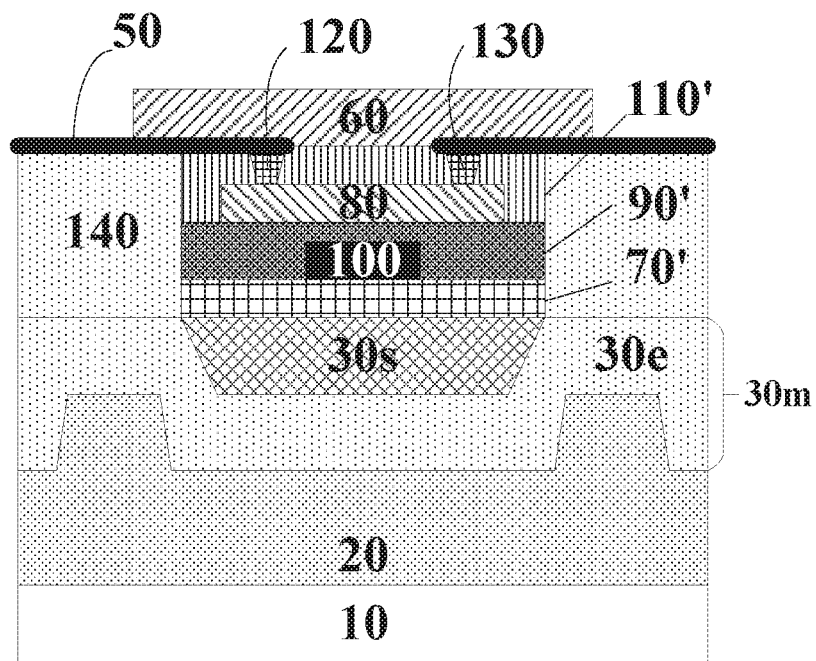

FIGS. 5C to 5F illustrate processes similar to those illustrated in FIGS. 4C to 4F. In FIG. 5C, a conductive material is disposed in the plurality of vias, thereby forming a source electrode 120 and a drain electrode 130. In FIG. 5D, a passivation layer 140 is formed in the one or more elastomeric regions Re, and on a side of the modified elastomer polymer layer 30m distal to the base substrate 10. In FIG. 5E, a plurality of stretchable signal lines 50 are formed on a side of the passivation layer 140 distal to the base substrate 10. The plurality of stretchable signal lines 50 are formed to connect the plurality of thin film transistors into a thin film transistors array. In FIG. 5F, an encapsulating layer 60 is formed on a side of the patterned inter-layer dielectric layer 110' distal to the base substrate 10, thereby encapsulating the plurality of thin film transistors.

In some embodiments, the method further includes forming a of organic light emitting diodes in the plurality of stiffened regions.

In another aspect, the present disclosure provides a stretchable electronic device fabricated by the method described herein.

In another aspect, the present disclosure provides a stretchable electronic device. In some embodiments, and referring to FIG. 1I and FIG. 2M, the stretchable electronic device includes a stretchable elastomer polymer base substrate (which is the modified elastomer polymer layer 30m in FIG. 1I and FIG. 2M) having a plurality of stiffened portions 30s respectively in a plurality of stiffened regions Rs spaced apart by one or more elastomeric portions 30e in one or more elastomeric regions Re; and a plurality of electronic devices 40 respectively on the plurality of stiffened portions 30s, and respectively in the plurality of stiffened regions Rs. Optionally, the stretchable elastomer polymer base substrate in the one or more elastomeric regions Re includes a polydimethylsiloxane-based material. Optionally, the stretchable elastomer polymer base substrate in the plurality of stiffened regions Rs includes silicon oxide ($SiO_x$).

Optionally, and referring to FIG. 2M, the stretchable electronic device have a plurality of second recesses R2 partially extending into the stretchable elastomer polymer base substrate (which is the modified elastomer polymer layer 30m in FIG. 2M), and the plurality of electronic devices 40 are formed respectively in the plurality of second recesses R2.

Optionally, and referring to FIG. 1I and FIG. 2M, the stretchable electronic device further includes a passivation layer 140 on the stretchable elastomer polymer base substrate (which is the modified elastomer polymer layer 30m in FIG. 1I and FIG. 2M) and in the one or more elastomeric regions Re.

Optionally, and referring to FIG. 1I and FIG. 2M, the stretchable electronic device further includes a plurality of stretchable signal lines 50 passing through the one or more elastomeric regions Re thereby connecting adjacent electronic devices of the plurality of electronic devices 40. Optionally, each of the plurality of stretchable signal lines 50 has a zig-zag pattern in the one or more elastomeric regions Re.

Optionally, and referring to FIG. 1I and FIG. 2M, the stretchable electronic device further includes an encapsulating layer 60 on a side of the plurality of electronic devices 40 distal to the stretchable elastomer polymer base substrate (which is the modified elastomer polymer layer 30m in FIG. 1I and FIG. 2M), thereby encapsulating the plurality of electronic devices 40.

In another aspect, the present disclosure provides a stretchable display apparatus having a stretchable electronic device described herein or fabricated by a method described herein. Examples of appropriate stretchable display apparatuses include, but are not limited to, an electronic paper, a mobile phone, a tablet computer, a television, a monitor, a notebook computer, a digital album, a GPS, etc.

In another aspect, the present disclosure provides a method of fabricating a stretchable substrate for electronic device. In some embodiments, the method includes forming an elastomer polymer layer on a base substrate; and selectively stiffening the elastomer polymer layer in a plurality of defined regions of the elastomer polymer layer, thereby forming a modified elastomer polymer layer comprising a plurality of stiffened portions respectively in a plurality of stiffened regions spaced apart by one or more elastomeric portions in one or more elastomeric regions. The plurality of stiffened portions having a Young's modulus greater than a Young's modulus of the one or more elastomeric portions.

Optionally, prior to forming the elastomer polymer layer, the method further includes forming a sacrificial material layer on the base substrate; and forming a plurality of first recesses in the sacrificial material layer thereby forming a sacrificial layer. Optionally, the plurality of first recesses respectively correspond to the plurality of defined regions.

Optionally, the method further includes removing the sacrificial layer thereby separating the modified elastomer polymer layer from the base substrate.

Optionally, prior to selectively stiffening the elastomer polymer layer, the method further includes forming a plurality of second recesses partially extending into the elastomer polymer layer. Optionally, the plurality of second recesses respectively correspond to the plurality of defined regions. Optionally, selectively stiffening the elastomer polymer layer includes stiffening an elastomer polymer material in regions corresponding to the plurality of second recesses.

Optionally, the method further includes separating the modified elastomer polymer layer from the base substrate; and stretching the modified elastomer polymer layer to form a stretched modified elastomer polymer layer.

Optionally, the method further includes transferring the stretched modified elastomer polymer layer to an intermediate base substrate.

Optionally, selectively stiffening the elastomer polymer layer includes exposing the elastomer polymer layer in a plurality of exposure regions with an ultraviolet light in an oxygen-containing atmosphere using a mask plate.

Optionally, the elastomer polymer layer includes a polydimethylsiloxane-based material. Optionally, the modified elastomer polymer layer in the one or more elastomeric regions includes the polydimethylsiloxane-based material. Optionally, the modified elastomer polymer layer in the plurality of stiffened regions comprises silicon oxide ($SiO_x$).

In another aspect, the present disclosure provides a stretchable substrate for electronic device fabricated by the method described herein.

In another aspect, the present disclosure provides a stretchable substrate for electronic device. The stretchable substrate includes a stretchable elastomer polymer base substrate having a plurality of stiffened portions respectively in a plurality of stiffened regions spaced apart by one or more elastomeric portions in one or more elastomeric regions.

Optionally, the stretchable elastomer polymer base substrate in the one or more elastomeric regions includes a polydimethylsiloxane-based material. Optionally, the stretchable elastomer polymer base substrate in the plurality of stiffened regions comprises silicon oxide ($SiO_x$).

In another aspect, the present disclosure provides a stretchable display apparatus having the stretchable substrate described herein or fabricated by a method described herein. Examples of appropriate stretchable display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a stretchable electronic device, comprising: forming an elastomer polymer layer on a base substrate; forming a plurality of recesses partially extending into the elastomer polymer layer; subsequent to forming the plurality of recesses, selectively stiffening the elastomer polymer layer in a plurality of defined regions of the elastomer polymer layer corresponding to the plurality of recesses, thereby forming a modified elastomer polymer layer comprising a plurality of stiffened portions respectively in a plurality of stiffened regions spaced apart by one or more elastomeric portions in one or more elastomeric regions, the plurality of stiffened portions having a Young's modulus greater than a Young's modulus of the one or more elastomeric portions; separating the modified elastomer polymer layer from the base substrate; and stretching the modified elastomer polymer layer to form a stretched modified elastomer polymer layer; transferring the stretched modified elastomer polymer layer to an intermediate base substrate, and subsequent to stretching the modified elastomer polymer layer and transferring the stretched modified elastomer polymer layer to the intermediate base substrate, forming a plurality of electronic devices on the stretched modified elastomer polymer layer respectively in the plurality of stiffened regions, each of the plurality of electronic devices formed on a side of one of the plurality of stiffened portions distal to the base substrate.

2. The method of claim 1, further comprising forming a plurality of stretchable signal lines passing through the one or more elastomeric regions thereby connecting adjacent electronic devices of the plurality of electronic devices.

3. The method of claim 2, wherein each of the plurality of stretchable signal lines has a zig-zag pattern in the one or more elastomeric regions.

4. The method of claim 1, subsequent to forming the plurality of electronic devices, further comprising forming an encapsulating layer encapsulating the plurality of electronic devices.

5. The method of claim 1, wherein forming the plurality of electronic devices comprises forming a plurality of thin film transistors respectively in the plurality of stiffened regions.

6. The method of claim 5, wherein the plurality of thin film transistors are a plurality of top-gate thin film transistors;

wherein forming the plurality of thin film transistors comprises:
    forming a buffer layer on a side of the modified elastomer polymer layer distal to the base substrate;
    forming an active layer on a side of the buffer layer distal to the modified elastomer polymer layer and in the plurality of stiffened regions;

forming a gate insulating layer on a side of the active layer distal to the buffer layer;

forming a gate electrode on a side of the gate insulating layer distal to the active layer and in the plurality of stiffened regions;

forming an inter-layer dielectric layer on a side of the gate electrode distal to the gate insulating layer;

patterning the buffer layer, the gate insulating layer, and the inter-layer dielectric layer so that portions of the buffer layer, the gate insulating layer, and the inter-layer dielectric layer in the one or more elastomeric regions are substantially removed;

forming a plurality of vias extending through the inter-layer dielectric layer and the gate insulating layer, exposing a source electrode contact region and a drain electrode contact region in the active layer;

disposing a conductive material in the plurality of vias thereby forming a source electrode and a drain electrode;

forming a passivation layer comprising an elastomer polymer material in the one or more elastomeric regions; and forming a plurality of stretchable signal lines respectively connected to the source electrode and the drain electrode, the plurality of stretchable signal lines formed to pass through the one or more elastomeric regions, thereby forming a thin film transistor array.

7. The method of claim 5, wherein the plurality of thin film transistors are a plurality of bottom-gate thin film transistors;

wherein forming the plurality of thin film transistors comprises:

forming a buffer layer on a side of the modified elastomer polymer layer distal to the base substrate;

forming a gate electrode on a side of the buffer layer distal to the modified elastomer polymer layer and in the plurality of stiffened regions;

forming a gate insulating layer on a side of the gate electrode distal to the buffer layer;

forming an active layer on a side of the gate insulating layer distal to the gate electrode and in the plurality of stiffened regions;

forming an inter-layer dielectric layer on a side of the active layer distal to the gate insulating layer;

patterning the buffer layer, the gate insulating layer, and the inter-layer dielectric layer so that portions of the buffer layer, the gate insulating layer, and the inter-layer dielectric layer in the one or more elastomeric regions are substantially removed;

forming a plurality of vias extending through the inter-layer dielectric layer, exposing a source electrode contact region and a drain electrode contact region in the active layer;

disposing a conductive material in the plurality of vias thereby forming a source electrode and a drain electrode;

forming a passivation layer comprising an elastomer polymer material in the one or more elastomeric regions; and forming a plurality of stretchable signal lines respectively connected to the source electrode and the drain electrode, the plurality of stretchable signal lines formed to pass through the one or more elastomeric regions, thereby forming a thin film transistor array.

8. The method of claim 5, wherein forming the plurality of electronic devices further comprises forming a plurality of organic light emitting diodes in the plurality of stiffened regions.

9. The method of claim 1, wherein selectively stiffening the elastomer polymer layer comprises exposing the elastomer polymer layer in a plurality of exposure regions with an ultraviolet light in an oxygen-containing atmosphere using a mask plate.

10. The method of claim 1, wherein the elastomer polymer layer comprises a polydimethylsiloxane-based material;

the modified elastomer polymer layer in the one or more elastomeric regions comprises the polydimethylsiloxane-based material; and the modified elastomer polymer layer in the plurality of stiffened regions comprises silicon oxide ($SiO_x$).

* * * * *